(12) United States Patent
Braun

(10) Patent No.: US 10,992,295 B2
(45) Date of Patent: Apr. 27, 2021

(54) CONTROLLING A HIGH-SIDE SWITCHING ELEMENT USING A BOOTSTRAP CAPACITOR

(71) Applicant: RENESAS ELECTRONICS CORPORATION, Tokyo (JP)

(72) Inventor: Hans-Juergen Braun, Duesseldorf (DE)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/960,949

(22) PCT Filed: Jan. 25, 2018

(86) PCT No.: PCT/EP2018/051888
§ 371 (c)(1),
(2) Date: Jul. 9, 2020

(87) PCT Pub. No.: WO2019/145040
PCT Pub. Date: Aug. 1, 2019

(65) Prior Publication Data
US 2020/0343888 A1    Oct. 29, 2020

(51) Int. Cl.
*H03K 3/00* (2006.01)
*H03K 17/16* (2006.01)
(Continued)

(52) U.S. Cl.
CPC .......... *H03K 17/687* (2013.01); *B60R 16/02* (2013.01); *H03K 5/24* (2013.01); *H03K 2217/0063* (2013.01)

(58) Field of Classification Search
None
See application file for complete search history.

(56) References Cited

U.S. PATENT DOCUMENTS 5,325,258 A * 6/1994 Choi ................. H03K 17/0828
323/276
7,106,105 B2 * 9/2006 Bryson ................ H03F 3/2171
326/82
(Continued)

OTHER PUBLICATIONS

International Search Report issued in corresponding International Patent Application No. PCT/EP2018/051888, dated Jun. 29, 2018.
(Continued)

*Primary Examiner* — Kenneth B Wells
(74) *Attorney, Agent, or Firm* — McDermott Will & Emery LLP

(57) ABSTRACT

A monolithic integrated circuit for controlling a high-side switching element for a load using a bootstrap capacitor is disclosed. The integrated circuit comprises a first supply voltage input for receiving a first input supply voltage $V_1$, a second supply voltage input for receiving a second, current-limited input supply voltage $V_{CP}$, a voltage-sensing input for receiving a source voltage, a first output for providing a drive signal $V_G$ to the switching element, a second output for providing a charging signal $V_{BS}$ to a bootstrap capacitor, a pre-driver for generating the drive signal, the pre-driver having a voltage input and an output which is coupled to the first output, and a power supply control section comprising first and second switches. The first and second switches are arranged in series between the first input and the second output, the second input is coupled to a node between the first and second switches, and the second node is coupled to a voltage input of the pre-driver. The first and second switches are selectively operable following switching of the switching element from an ON state to an OFF state and in response to a determination that the source voltage is below a predetermined level, to decouple the second output and in response to determination that the source voltage is above (Continued)

the predetermined level to couple the second output to the second output.

8 Claims, 4 Drawing Sheets

(51) Int. Cl.
    *H03K 17/687*    (2006.01)
    *B60R 16/02*     (2006.01)
    *H03K 5/24*      (2006.01)

(56) References Cited

U.S. PATENT DOCUMENTS

| | | | |
|---|---|---|---|
| 8,633,745 B1 * | 1/2014 | Peterson | H03K 19/018521 |
| | | | 327/156 |
| 8,724,357 B2 | 5/2014 | Imanishi et al. | |
| 9,086,705 B2 * | 7/2015 | Ejury | G05F 3/02 |
| 9,612,604 B2 * | 4/2017 | Hayashi | G05F 1/56 |
| 9,680,377 B2 * | 6/2017 | Zhang | H02M 1/08 |
| 10,536,070 B1 * | 1/2020 | Penzo | H03K 17/063 |
| 10,587,262 B1 * | 3/2020 | Morini | H03K 17/166 |
| 2015/0115718 A1 | 4/2015 | Yoshida et al. | |
| 2018/0004238 A1 | 1/2018 | Shen et al. | |

OTHER PUBLICATIONS

Transmittal of International Preliminary Report on Patentability and Written Opinion of the International Searching Authority for PCT/EP2018/051888, dated Jul. 28, 2020.

* cited by examiner

CONTROLLING A HIGH-SIDE SWITCHING ELEMENT USING A BOOTSTRAP CAPACITOR

CROSS REFERENCE TO RELATED APPLICATIONS

This application is the U.S. National Phase under 35 U.S.C. § 371 of International Application No. PCT/EP2018/051888, filed on Jan. 25, 2018, the entire contents are hereby incorporated by reference.

FIELD OF THE INVENTION

The present invention relates to a monolithic integrated circuit for controlling a high-side switching element, in particular, an n-channel metal-oxide semiconductor field-effect transistor, using a bootstrap capacitor.

BACKGROUND so High-side switching elements (or "switches") are increasingly being used to drive loads, such as actuators, in automotive applications including engine control, passenger comfort electronics and chassis control.

High-side switches can be realized using power n-channel metal-oxide semiconductor field-effect transistors or "N-channel MOSFETs" (often referred to simply as "nMOS transistors). nMOS transistors tend to be preferred over pMOS transistors due to having a lower ON-resistance and being cheaper. However, nMOS transistors require a high source-gate voltage to switch it ON and so a suitable circuit for supplying a higher voltage is required.

Referring to FIG. 1, one such suitable circuit is a bootstrap circuit which includes a bootstrap capacitor $C_{bs}$ and an auxiliary voltage source stacked above a supply voltage source, which in this case is a battery. The battery supplies a voltage $V_{bat}$ to the nMOS transistor drain. A load $Z_{load}$ is connected between an nMOS transistor source node and ground GND. To turn the nMOS transistor ON, a pre-driver circuit is supplied with a higher voltage $V_{CP}$ using the auxiliary voltage source, where $V_{CP}>V_{bat}$.

Many applications have a complex load with significant inductive component. Consequently, turning the nMOS transistor causes the load $Z_{load}$ to drive the transistor source node $V_S$ negative. The negative voltage can be either clamped using a suitable element, such as a Zener diode (not shown), or be controlled an integrated pre-driver power control circuit supplied with a voltage $V_{CP}$ from the auxiliary voltage source and with a stabilized voltage $V_1$ from a stable voltage source.

The nMOS transistor is often a discrete element, while the pre-driver and its power supply control circuit are provided in an integrated circuit, such as an application specific integrated circuit (ASIC).

A challenge facing pre-driver integrated circuits (which are typically based on a BiCMOS process) is to how to deal with negative voltages at the transistor source node and, thus, the pre-driver negative supply level. The pre-driver should ensure not only that the nMOS transistor is switched ON in the ON state, but also that the transistor is switched OFF in the OFF state. Moreover, the speed (i.e., slew rate) of the negative so source node drop in both transitions should not lead to big transient currents into or out of the bootstrap capacitor $C_{bs}$ and so avoid circuit destruction and/or reverse current to the stabilized base supply $V_1$. This is made more challenging since the slew rate of clamping events can have a value lying in a wide range, for example, from $-100$ mVµs$^{-1}$ to $-300$ Vµs$^{-1}$.

SUMMARY

According to a first aspect of the present invention there is provided a monolithic integrated circuit for controlling a high-side switching element (such as an nMOS) for a load using a bootstrap capacitor. The integrated circuit comprises a first supply voltage input for receiving a first input supply voltage, a second supply voltage input for receiving a second, current-limited input supply voltage, a voltage-sensing input for receiving a source voltage, a first output for providing a drive signal to the switching element, a second output for providing a charging signal to a bootstrap capacitor, a pre-driver for generating the drive signal, the pre-driver having a voltage input and an output which is coupled to the first output, and a power supply control section comprising first and second switches. The first and second switches are arranged in series between the first input and the second output, the second input is coupled to a node between the first and second switches, and the second node is coupled to a voltage input of the pre-driver. The first and second switches are selectively operable, following switching of the switching element from an ON state to an OFF state and, thereafter, in response to a determination that the source voltage is below a predetermined level, to decouple the second output and, in response to determination that the source voltage is above the predetermined level, to couple the second output to first input.

The first and second switches may be selectively operable, in the ON state, to decouple the first input from the node. The first and second switches may be selectively operable following switching from the ON state to the OFF state to couple the first input to the node.

The monolithic integrated circuit may further comprise first and second comparators arranged to control the first and second switches respectively, wherein the first comparator has an input coupled to the second output, and the second comparator has an input coupled to voltage-sensing input.

The voltage input of the pre-driver is may be a first voltage input and the pre-driver may have a second voltage input which is coupled to the voltage-sensing input.

According to a second aspect of the present invention there is provided apparatus comprising the monolithic integrated circuit of the first aspect of the invention, and a bootstrap capacitor coupled between the second output and the voltage-sensing input.

The apparatus may further comprise a high-side switch having a control node coupled to the first output, a load coupled to the high-side switch, a battery coupled to the high-side switch, a first input supply voltage source coupled to the first supply voltage input and a second input supply voltage source coupled to the second supply voltage input.

The load may be a coil, such as, for example, a coil of a solenoid or a stator coil of a motor.

The integrated circuit may be an application-specific integrated circuit (ASIC).

The apparatus may further comprise a controller (such as a microcontroller) in communication with the integrated circuit.

According to a third aspect of the present invention there is provided a motor vehicle comprising the integrated circuit of first aspect or the apparatus of the second aspect of the invention.

The motor vehicle may be a motorcycle, an automobile (sometimes referred to as a "car"), a minibus, a bus, a truck or lorry. The motor vehicle may be powered by an internal combustion engine and/or one or more electric motors.

BRIEF DESCRIPTION OF THE DRAWINGS

Certain embodiments of the present invention will now be described, by way of example, with reference to FIGS. 2 to 4 of the accompanying drawings, in which.

DETAILED DESCRIPTION OF CERTAIN EMBODIMENTS

Figure 1:
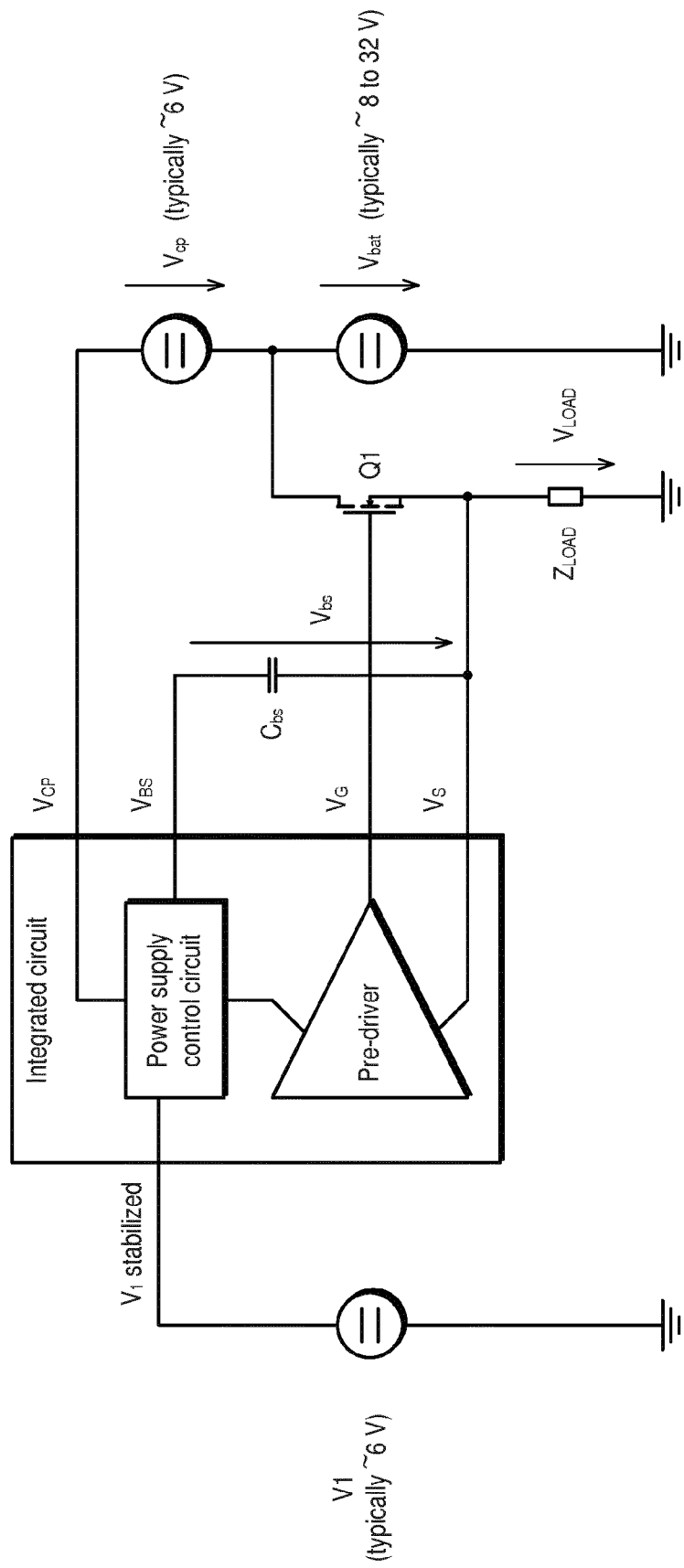
FIG. 1 illustrates a high-side switch, a load, an integrated circuit which includes a pre-driver, a bootstrap capacitor and voltage sources.
Figure 2:
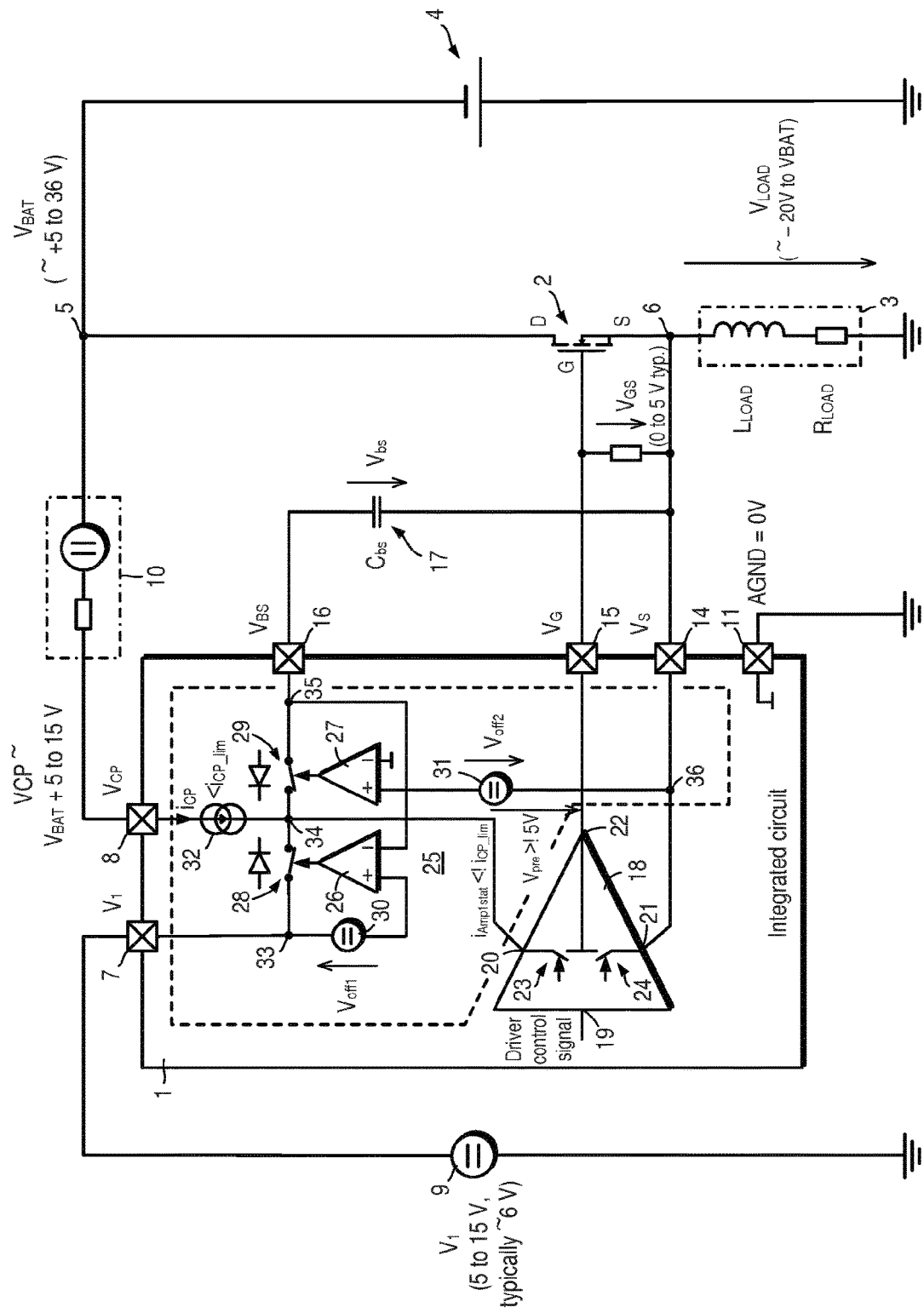
FIG. 2 illustrates a high-side switch and a load, an integrated circuit which includes a pre-driver and a supply control section in accordance with the present invention, a bootstrap capacitor and voltage sources.

Referring to FIG. 2, a pre-driver integrated circuit (IC) 1 for driving an external, high-side discrete nMOS field-effect transistor 2 for switching a complex load 3 powered by a supply voltage $V_{BAT}$ from a battery 4 via a supply voltage node 5 is shown. The nMOS transistor 2 and load 3 are connected in series, via a source node 6, interposed between the battery supply node 5 and ground GND.

The pre-driver IC 1 includes first and second power-supply pins 7, 8 (or "inputs") for receiving a first, stabilized supply voltage $V_1$ from a first power supply 9 and a second, low-current supply voltage $V_{CP}$ from a second, low-current (or "weak") auxiliary power supply 10, for example, in the form of a charge pump. The pre-driver integrated circuit 1 also includes an analogue ground pin 11 for connection to ground GND.

Figure 4:
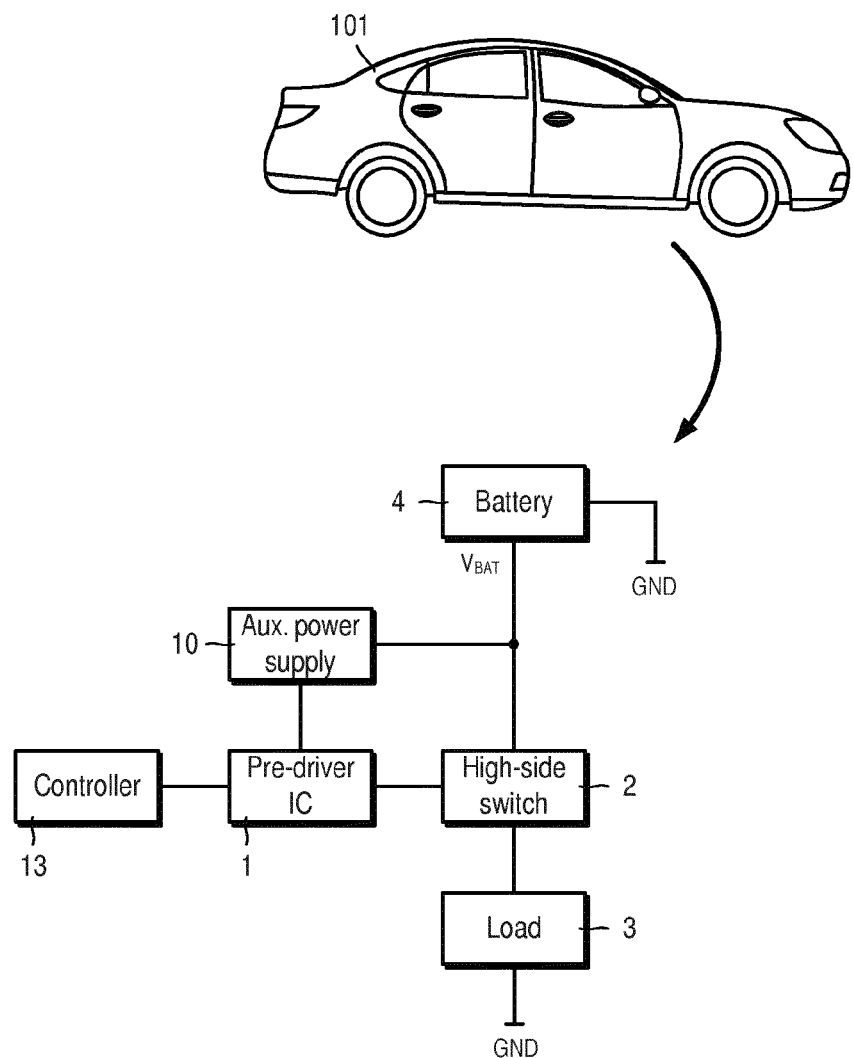
FIG. 4 illustrates a motor vehicle.

The pre-driver IC 1 includes one or more control input pins (not shown) for receiving one or more control signals (not shown) from a controller 13 (FIG. 4) for example, in the form of a microcontroller or system-on-a-chip (SoC).

The pre-driver IC 1 includes a source level sensing pin 14 (or "source node input") for connection to the source node 6.

The pre-driver IC 1 includes a gate drive pin 15 (or "gate drive output") for connection to the gate G of the nMOS transistor 2 for applying a gate voltage $V_G$ and a bootstrap capacitor charging pin 16 (or "bootstrap capacitor charging output") for applying a bootstrap capacitor voltage $V_{bs}$ across a bootstrap capacitor 17.

The bootstrap capacitor 17 is connected between the source node pin 14 and the bootstrap capacitor pin 16. The bootstrap capacitor 17, for example, may have a value of 220 nF.

The pre-driver IC 1 includes a pre-driver 18 (or "gate driver") which includes a control signal input 19 for receiving a driver ON/OFF signal, first and second voltage inputs 20, 21, and an output 22 which is coupled to the gate drive pin 15. The pre-driver 18 comprises first and second switches 23, 24. The first switch 23 is used to control turn ON (i.e., gate charge) of the external FET 2, while the second switch 24 is used to control turn OFF control (i.e., gate discharge). Both switches 23, 24 may include a current limitation for slew rate control of the external FET 2.

The pre-driver IC 1 includes a power supply control section 25 (herein also referred to as "supply management section") which includes first and second comparators 26, 27 having respective outputs which control first and second supply control switches 28, 29 respectively, first and second voltage sources 30, 31 and a current source 32.

The first power-supply pin 7 is connected to a first internal node 33. The first voltage source 30 is connected between the first internal node 33 and the non-inverting input of the first comparator 26. The first switch 28 is connected between the first internal node 33 and a second internal node 34 and the second switch 29 is connected between the second internal node 34 and a third internal node 35 which is connected to the bootstrap capacitor charging pin 16. The third internal node 35 is connected directly to the inverting input of the first comparator 26. The second voltage source 31 is connected between the non-inverting input of the second comparator 27 and a fourth internal node 36 between the second current input 23 and the source node pin 15. The inverting input of the second comparator 27 is connected to ground. The current source 32 is connected between the second power-supply pin 8 and first voltage input 20 of the pre-driver 18.

The charge pump 10 has a limited current capability, for example, of 1 mA. Moreover, charge pump 10 may need to supply n pre-drivers, where n>1 (e.g., n=8). Thus, an individual charge pump current supplied to the pre-driver 18 may be further limited, for example, to 1 mA/8=125 µA). The individual charge pump current (e.g., 125 µA) represents the budget for the pre-driver 18 for all internal switch controls and also (static) gate control. Thus, the pre-driver current consumption is arranged so as not to exceed the individual charge pump current budget, in other words, iAmp1stat<!iCP_lim.

As will be explained in more detail hereinafter, the supply control section 25 selectively controls which power sources 9, 10 are coupled to the bootstrap capacitor 17 and to the pre-driver 19, especially when the source level $V_S$ is negative.

By splitting supply management into different phases, a clean pre-driver supply can be achieved without significant charging and discharging of the bootstrap capacitor 17. As a result, ripple noise and overload at the stabilized source 9 can be avoided and, furthermore, the pre-driver supply voltage can be kept clean (i.e., ripple-free) for its intended function, i.e., gate control.

Figure 3:
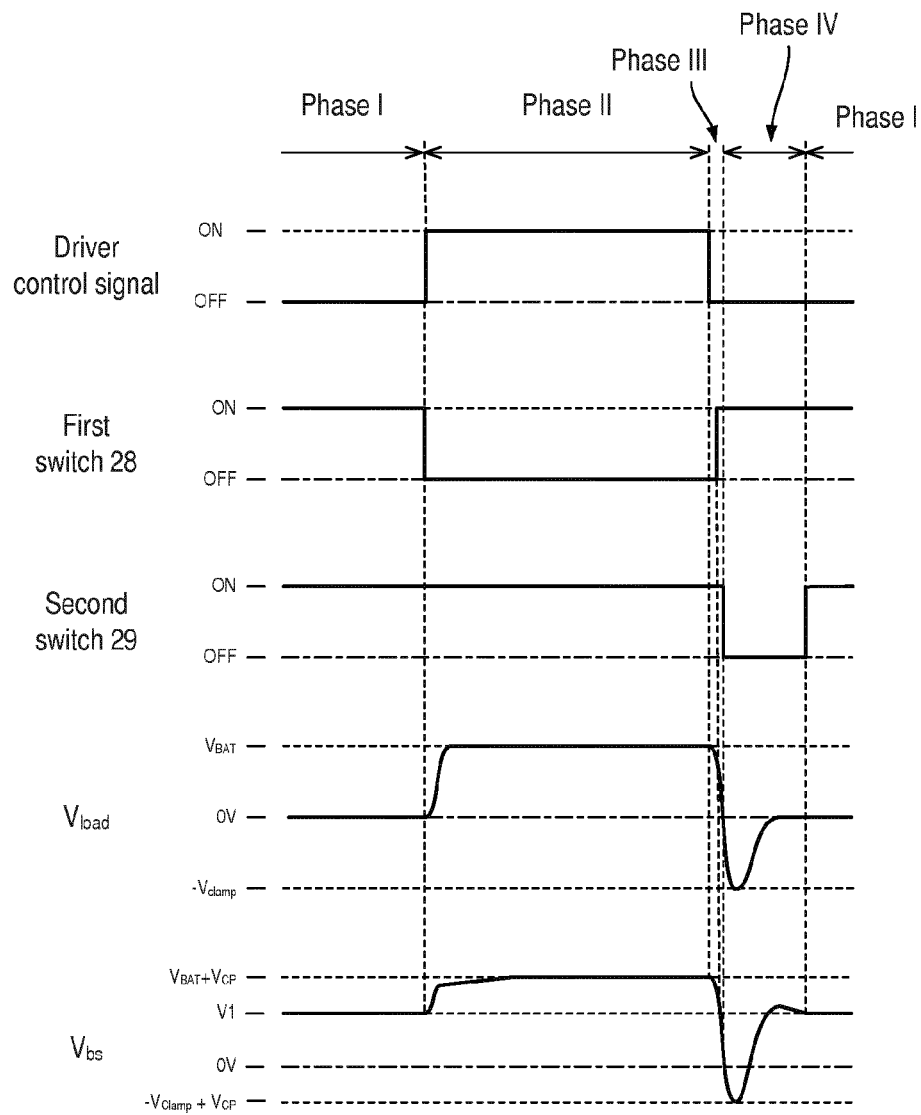
FIG. 3 is a timing chart schematically illustrating operation of first and second switches in the supply control section shown in FIG. 2 and voltages across a load and bootstrap capacitor.

Referring also to FIG. 3, integrated pre-driver supply control is split into four different operational phases.

Phase I: Driver 2 in a Static OFF State

During phase I, the first and second supply control switches 28, 29 are ON (i.e., closed). Accordingly, the first voltage supply 9 supplies the first voltage $V_1$ to the pre-driver 18 and charges the bootstrap capacitor 17. The second, current-limited voltage supply 10 (which has a current limit $I_{CP\_lim}$) has minimal effect.

Phase II: Driver 2 Turns ON

During phase II, the load voltage $V_{load}$ (which is equal to the source node level $V_S$) rises to about $V_{BAT}$. During the transition into the ON state, the bootstrap supply $V_{BS}$ exceeds the first voltage $V_1$ and so the first comparator 26 turns the first switch OFF (i.e., opens the first switch). Static current consumption of the pre-driver 18 is compensated by the current-limited voltage supply 10. Meanwhile, the second switch 29 remains ON (i.e., remains closed).

Phase III: Driver 2 Switches into an OFF State with Negative Voltage at the Load During a negative transition, the supply control can operate in two sub-phases:

First, if $V_{Bs}$ drops below the first voltage $V_1$, then the first switch 26 turns ON, while the the second switch 27 remains ON. This sub-phase occurs in case the dynamic gate control had discharged the bootstrap capacitor 17.

Secondly, if the load voltage $V_{load}$ (which is equal to the source node level $V_S$) becomes negative, then the first switch 28 remains ON and the second switch 29 quickly turns OFF. The second switch 29 is controlled by the second comparator 27 in response to detecting a negative load voltage. An offset $V_{off2}$ may apply. Thus, the bootstrap capacitor 17 will not charge up with a big transient current and the pre-driver 18 still operates with a positive supply at around $V_1$.

Phase IV: Driver 2 Stays OFF, but Recovers from Negative Clamping, Going Back into to phase 1 ($V_S \rightarrow 0V$)

When the load inductive energy is consumed, the load voltage recovers from negative level back to around 0V. The second comparator 27 enables the second switch 29, while the first switch 28 is still ON and phase I starts again.

Referring to FIG. 11, a motor vehicle 101 is shown.

The motor vehicle 101 includes the pre-driver IC 1, the high-side switch 2 and load 3 interposed between the batter 4 and ground GND. The pre-driver IC 1 is controlled by a controller 13.

MODIFICATIONS

It will be appreciated that various modifications may be made to the embodiments hereinbefore described. Such modifications may involve equivalent and other features which are already known in the design, manufacture and use of pre-driver ICs and high-side switches and component parts thereof and which may be used instead of or in addition to features already described herein. Features of one embodiment may be replaced or supplemented by features of another embodiment.

Although claims have been formulated in this application to particular combinations of features, it should be understood that the scope of the disclosure of the present invention also includes any novel features or any novel combination of features disclosed herein either explicitly or implicitly or any generalization thereof, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

The invention claimed is:

1. A monolithic integrated circuit for controlling a high-side switching element for a load using a bootstrap capacitor, the integrated circuit comprising:
   a first supply voltage input for receiving a first input supply voltage $V_1$;
   a second supply voltage input for receiving a second, current-limited input supply voltage $V_{CP}$;
   a voltage-sensing input for receiving a source voltage;
   a first output for providing a drive signal $V_G$ to the switching element;
   a second output for providing a charging signal $V_{BS}$ to the bootstrap capacitor;
   a pre-driver for generating the drive signal, the pre-driver having:
      a voltage input; and
      an output which is coupled to the first output; and
   a power supply control section comprising:
      first and second switches;
   wherein the first and second switches are arranged in series between the first supply voltage input and the second output, the second supply voltage input is coupled to a node input between the first and second switches, and the node is coupled to the voltage input of the pre-driver, and
   wherein the first and second switches are selectively operable following switching of the switching element from an ON state to an OFF state and in response to a determination that the source voltage is below a predetermined level, to decouple the second output and, thereafter, in response to determination that the source voltage is above the predetermined level to couple the second output to the first supply voltage input.

2. The monolithic integrated circuit of claim 1, wherein the first and second switches are selectively operable, in the ON state, to decouple the first input from the node.

3. The monolithic integrated circuit of claim 1, wherein the first and second switches are selectively operable following switching from the ON state to the OFF state to couple the first input to the node.

4. The monolithic integrated circuit of claim 1, further comprising:
   first and second comparators arranged to control the first and second switches respectively;
   wherein the first comparator has an input coupled to the second output, and the second comparator has an input coupled to voltage-sensing input.

5. Apparatus comprising:
   the monolithic integrated circuit of claim 1; and
   the bootstrap capacitor is coupled between the second output and the voltage-sensing input.

6. The apparatus of claim 5, further comprising:
   a high-side switch having a control node G coupled to the first output;
   a load coupled to the high-side switch;
   a battery coupled to the high-side switch;
   a first input supply voltage source coupled to the first supply voltage input; and
   a second input supply voltage source coupled to the second supply voltage input.

7. A motor vehicle comprising the apparatus of claim 5.

8. A motor vehicle comprising the apparatus of claim 6.

* * * * *